(12) United States Patent  
Nestler et al.

(10) Patent No.: US 6,593,865 B2  
(45) Date of Patent: Jul. 15, 2003

(54) RAPID MULTIPLEXING ANALOG TO DIGITAL CONVERTER

(75) Inventors: Eric G. Nestler, Harvard, MA (US); Christopher M. Toliver, West Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/160,609

(22) Filed: May 31, 2002

(65) Prior Publication Data

US 2003/0034908 A1 Feb. 20, 2003

Related U.S. Application Data

(60) Provisional application No. 60/312,664, filed on Aug. 15, 2001.

(51) Int. Cl.$^7$ ................................. H03M 1/00
(52) U.S. Cl. ................. 341/141; 341/143; 341/155
(58) Field of Search ................. 341/141, 143, 341/155

(56) References Cited

U.S. PATENT DOCUMENTS

| | | | |
|---|---|---|---|
| 5,055,843 A | 10/1991 | Ferguson, Jr. et al. | 341/143 |
| 5,134,401 A | 7/1992 | McCartney et al. | 341/143 |
| 5,248,971 A | 9/1993 | Mandl | 341/141 |
| 5,311,181 A | 5/1994 | Ferguson, Jr. et al. | 341/143 |
| 5,544,089 A | 8/1996 | Hemminger et al. | 364/492 |
| 5,617,090 A | 4/1997 | Ma et al. | 341/141 |
| 5,627,536 A * | 5/1997 | Ramirez | 341/141 |
| 5,862,069 A | 1/1999 | Nestler | 364/754.01 |
| 6,278,392 B1 | 8/2001 | Nestler | 341/143 |

OTHER PUBLICATIONS

Chow, et al, "Overloading in Multistage Sigma–Delta Modulators", *Proceedings of IEEE AP–ASIC*, Aug. 23–25, 1999, Seoul, Korea.

* cited by examiner

*Primary Examiner*—Jean Bruner Jeanglaude  
(74) *Attorney, Agent, or Firm*—Bromberg & Sunstein LLP

(57) ABSTRACT

A multiplexed signal processor is described as having an input circuit for receiving multiple input signals. A modulator processes a selected input signal to produce a representative digital output. The modulator includes an integrator that integrates the difference between the selected input signal and a feedback signal representative of the digital output. A signal control circuit selects in turn by time division multiplexing each input signal for a processing period as the selected input signal, and stores the digital output and the integrator state at the end of each processing period. After an initial processing period for each input signal, each processing period begins based on the digital output and the integrator state from the end of the previous processing period for that input signal.

21 Claims, 4 Drawing Sheets

XP1 = MODB*φ1 + MOD*φ2  
XP2 = MOD*φ1 + MODB*φ2

⊥ = Modulator common mode voltage, Vref=+2.5V.  
⊥ = Modulator input common mode voltage, = 0V.

XP1 = MODB*φ1 + MOD*φ2
XP2 = MOD*φ1 + MODB*φ2

⏚ = Modulator common mode voltage, Vref=+2.5V.

XP1 = MODB*φ1 + MOD*φ2

XP2 = MOD*φ1 + MODB*φ2

▽ = Modulator common mode voltage, Vref=+2.5V.

⏚ = Modulator input common mode voltage, = 0V.

RAPID MULTIPLEXING ANALOG TO DIGITAL CONVERTER

This application claims priority from provisional patent application 60/312,664, filed Aug. 15, 2001, the contents of which are incorporated herein by reference.

FIELD OF THE INVENTION

The invention generally relates to digital signal processing, and more particularly, to a multiplexed state saving analog-to-digital converter.

BACKGROUND ART

An analog-to-digital converter (ADC), such as a sigma delta modulator, provides a digital bit stream output of either single or multiple digital bits that are representative of an analog input signal. This bit stream output has noise that varies in the frequency domain, known as shaped noise. Shaped noise is typically removed by a digital low-pass filter having a cutoff frequency below the frequency where the shaped noise rises above the flat-band noise. Typically, the cutoff frequency is 1/16th to 1/64th of the converter sample rate.

FIG. 1 shows the functional architecture of a generic second-order, switched-capacitor, sigma delta modulator ADC similar to that described in U.S. Pat. No. 6,040,793, the contents of which are incorporated herein by reference. Input circuit 10 provides analog input signals for sampling, $V_{inP}$ and $V_{inN}$. Subtracted from the input voltage signals are positive and negative feedback signals, $Ref_P$ and $Ref_N$, from feedback circuit 11. The first stage integrator 12 receives the difference signals and provides an integrated output signal via coupling capacitor $C_{S2}$ to second stage integrator 13. Each integrator 12 and 13 also has internal feedback capacitors, $C_{i1}$ and $C_{i2}$ respectively that feedback the integrated outputs to the integrator inputs. Thus, the voltage across these internal feedback capacitors $C_{i1}$ and $C_{i2}$ reflects the internal state of their associated integrators. The integrated outputs of each integrator 12 and 13 are provided via coupling capacitors $C_S 31$ and $C_S 32$ respectively to comparator 14. The output of comparator 14 is a digital data bitstream representative of the analog input voltages. This bitstream is supplied to a decimator filter (not shown) that reduces the out-of-band quantization noise component of the samples and generates a data stream of filtered output samples. A third-order sinc filter may be used, for example, in a particular ADC.

An ADC can be adapted to time division multiplex (TDM) between multiple input signals. Such a multiplexing ADC is described for example, in "A Programmable Power Metering Chip," Y. M. Lin et al., Proceedings of the IEEE 1993 Custom Integrated Circuits Conference, 1993, pp. 25.7.1–25.7.4, incorporated herein by reference. FIG. 2 in that article shows the multiplexed analog input and multiplexed digital filters following the modulator. Further description of such an approach is also provided in "A Single Shot Sigma Delta Analog to Digital Converter for Multiplexed Applications"; C. Lyden, et al, and U.S. Pat. Nos. 5,544,089; 5,345,236; and 5,627,536, all of which are incorporated herein by reference.

One specific application for a multiplexed ADC would be in an electrical power measuring device. In contemporary power distribution systems, the fundamental line frequency is typically 50 or 60 Hertz, but it should be appreciated that significant energy is present in harmonics as high as the 15$^{th}$ harmonic. The dynamic range requirements of an ADC are also formidable: 20 bits of digital resolution are needed to achieve an accuracy within 0.1% over a 1000:1 current range.

FIG. 2 shows an example of TDM of three input signals to an ADC with each analog input being selected for a processing period consisting of a fixed number of modulator samples before the multiplexer is switched to the next input waveform. In a power metering application, three voltage phases and three current phases need to be sampled. Thus, two three-channel multiplexed ADC modulators are sufficient. Each of the ADC modulators cycles through the same three inputs using the same time division to produce synchronized voltage-current sample pairs for each phase being measured. The separate phases are not themselves synchronized, of course, and are skewed in time from each other. This does not present a problem because the total three-phase power used for energy calculation is an arithmetic sum of the three individual power values.

Existing methods of multiplexing multiple analog inputs to a sigma delta modulator require drastically reducing the resulting sampled data rate. The sample rate of the final de-multiplexed output, $F_{mux}$, is the fastest rate possible from a multiplexed ADC with a successive approximation register-type (SAR) architecture. In contemporary systems, $F_{mux}$ is far lower than the basic modulator sample rate, $F_s$, or even than $F_s/m$, where m is the number of analog input channels.

When a sigma delta modulator is used for a TDM ADC, further filtering and decimation is generally required after the output bit stream has been de-multiplexed into multiple TDM bit streams. And when switching from one input signal to the next, the internal analog integrators and the output digital filter all have to settle to appropriate conditions for the new input signal waveform. Typically this settling time is longest for the digital filter.

The settling time of a third-order sinc filter is determined by the first valid value of the order times the decimation rate, e.g., 96 times the modulator sample time. In such a case, the final output data rate would be Fs/m/96. Unless the sampling rate Fs is very high, this final rate can become too low for accurate use in some applications.

SUMMARY OF THE INVENTION

A representative embodiment of the present invention includes a multiplexed signal processor having an input circuit for receiving multiple input signals. A modulator processes a selected input signal to produce a representative digital output. The modulator includes an integrator that integrates the difference between the selected input signal and a feedback signal representative of the digital output. A signal control circuit selects in turn by time division multiplexing each input signal for a processing period as the selected input signal, and stores the digital output and the integrator state at the end of each processing period. After an initial processing period for each input signal, each processing period begins based on the digital output and the integrator state from the end of the previous processing period for that input signal.

Another embodiment of the present invention includes a multiplexed signal processor having an input circuit for receiving multiple input signals. A multistage modulator processes a selected input signal to produce a representative digital output. The modulator includes one or more integrator stages. One of the integrator stages includes a separate discrete integrator for each input signal, where each integrator produces an output representing the integration of the discrete integrator input and the discrete integrator output. The other integrator stage includes a time division multiplexed integrator that selects each input signal in turn for a processing period to produce an output representing the integration of the multiplexed integrator input and the multiplexed integrator output. After an initial processing period for each input signal, each processing period begins based on the digital output and multiplexed integrator output from the end of the previous processing period for that input signal.

In an embodiment, the multiple input signals may be either analog or digital signals. A switched capacitor arrangement may store at least one of the digital outputs and the integrator states. The signal processor may be a sigma delta modulator. The signal processor may also include a filter in communication with the modulator for removing noise from the digital output, e.g., a sinc filter.

BRIEF DESCRIPTION OF THE DRAWINGS

The present invention will be more readily understood by reference to the following detailed description taken with the accompanying drawings, in which.

DETAILED DESCRIPTION OF SPECIFIC EMBODIMENTS

Embodiments of the present invention integrate state saving multiplexing circuitry into the signal paths inside an ADC modulator such as a sigma delta modulator. Ideally, a sigma delta modulator with m bit-stream outputs (corresponding to the number of analog inputs that can be selected) should have an independent shaped noise spectrum for each bit stream output such that the output bit stream average rate would be Fs/m. This can be accomplished by separately saving the modulator state values for each multiplexed input. For a second order modulator the following state values are saved:

The comparator digital output (either single bit or multi-bit); and

The integrator states—one for a first order modulator, two for a second order modulator, etc. (Although in some applications it may not be desirable to save all of the integrator outputs.) These saved values are used to restore the state of the modulator when the input multiplexer returns to the appropriate input. It should be appreciated that this approach is suitable for any order modulator.

Embodiments can also be implemented in all digital designs. For example, sometimes it is useful to re-modulate a digital sample data stream of n-bit words to a single-bit or m-bit stream. This could be for gate area advantages, for example. In such an embodiment, the digital modulator could use adders and registers as the integrators.

In a three phase power measurement application that has six processing channels (three for phase voltage and three for phase current) the initial processing period for each voltage channel should occur at the same absolute time as the initial processing period for the same phase current channel. This ensures that the active power calculation for each phase uses time synchronous samples.

Figure 1:
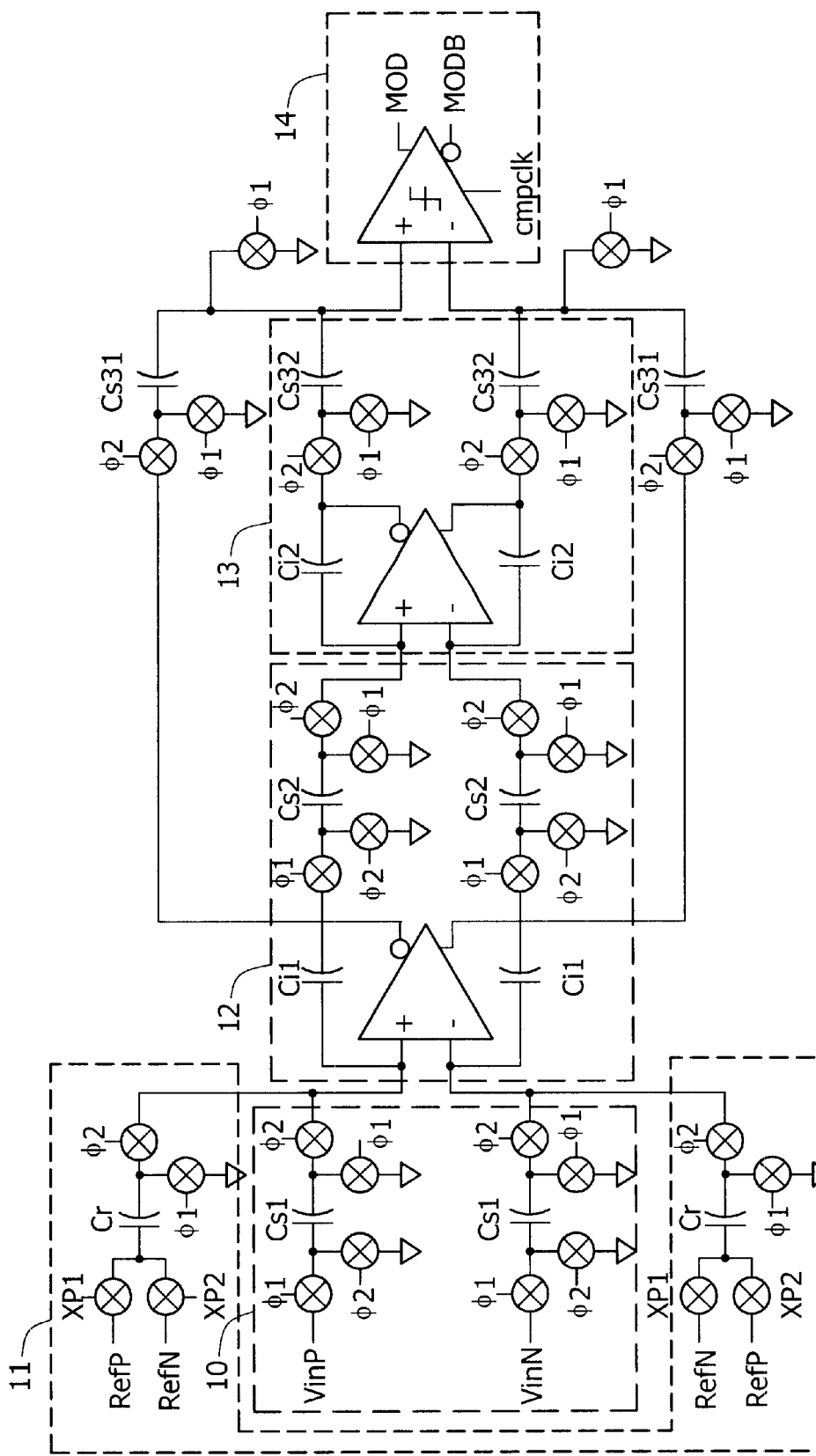
FIG. 1 shows the functional architecture of a generic second-order, switched-capacitor, sigma delta modulator ADC.
Figure 2:
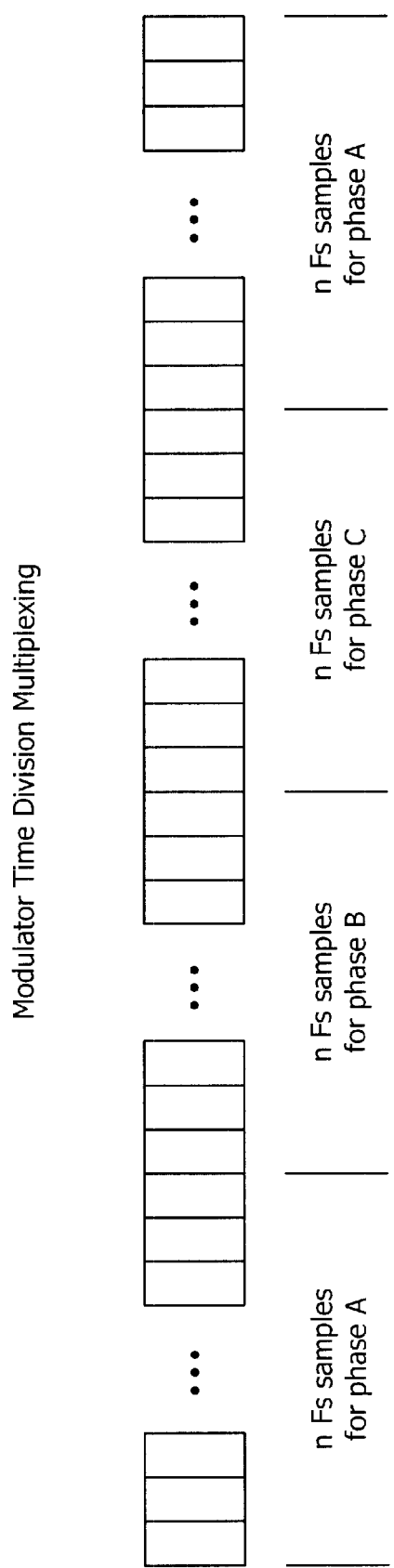
FIG. 2 shows an example of TDM of three input signals to an ADC with each analog input being selected for a processing period consisting of a fixed number of modulator samples before the multiplexer is switched to the next input waveform.

For a fully differential second order sigma delta modulator such as the one shown in FIG. 1, there are five quantities that are saved for each input channel time slot:

1. First stage integrator positive voltage, $V_{Ci1+}$
2. First stage integrator negative voltage, $V_{Ci1-}$
3. Second stage integrator positive voltage, $V_{Ci2+}$
4. Second stage integrator negative voltage, $V_{Ci2-}$, and
5. Comparator output digital state, MOD.

If the integrator capacitors $C_i1$ and $C_i2$ are duplicated, one for each analog input channel, then the integrator voltages can be saved on each of these capacitors at the end of each respective input channel processing period.

Figure 3:
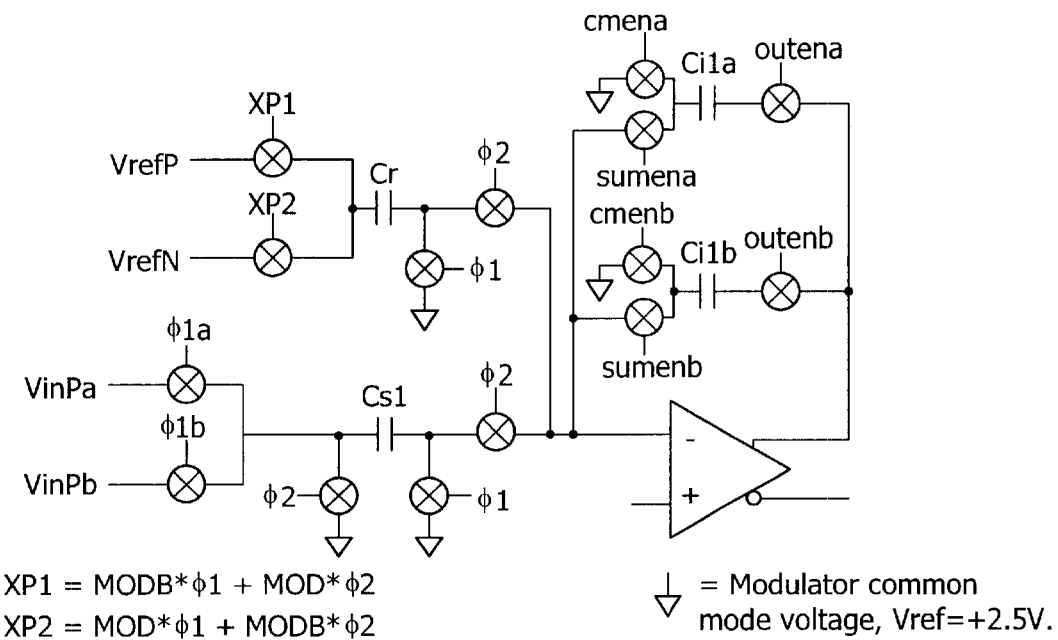
FIG. 3 shows a portion of a sigma delta modulator similar to that of FIG. 1 as modified according to an embodiment of the present invention.
Figure 3:
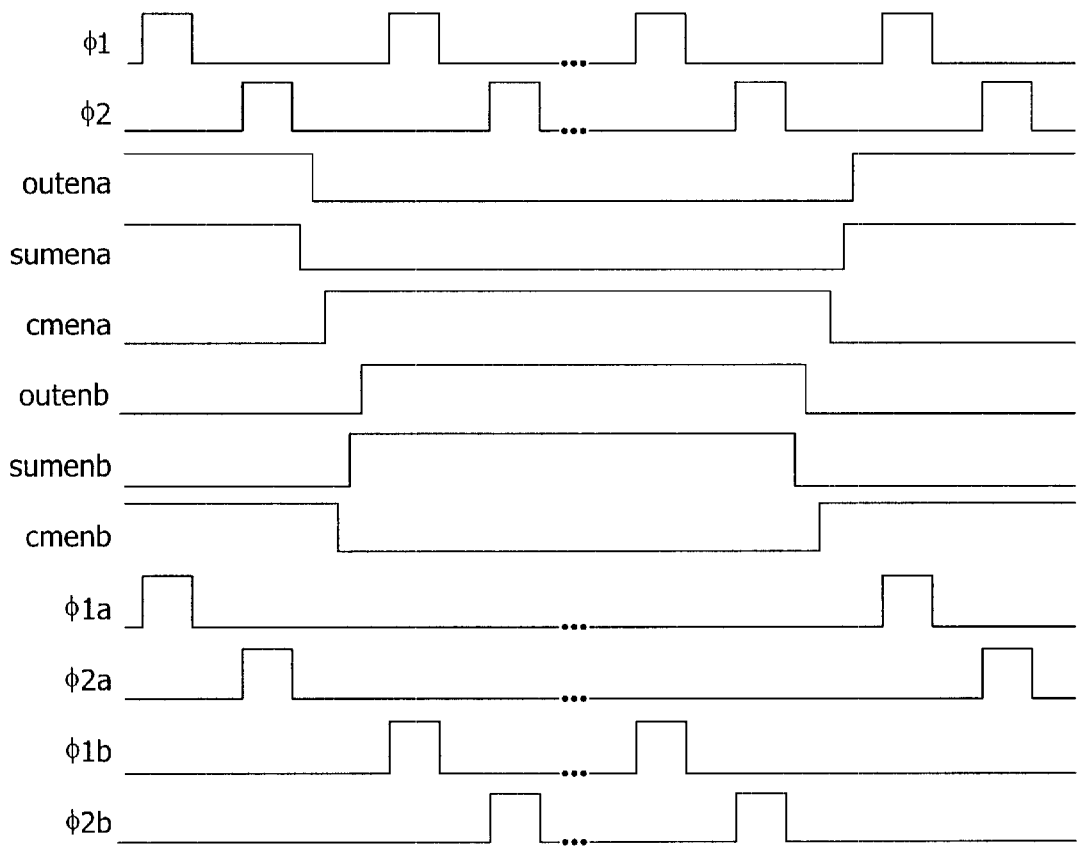

FIG. 3 shows a portion of a sigma delta modulator similar to that of FIG. 1 as modified according to an embodiment of the present invention to add two parallel integrator capacitors $C_i1a$ and $C_i1b$ to the first stage integrator to multiplex two analog input channels. For clarity, FIG. 3 shows only the positive channel arrangement of the first stage integrator, but similar arrangements of parallel capacitors are implemented for the negative channel of the first stage integrator as well as for both positive and negative channels of any subsequent integrator stages. Also, multiplexing of three or more input channels is a simple extension of the principles used to implement two-channel multiplexing as shown. When the A-channel input $V_{inPa}$ is active, its associated integrator capacitor $C_i1a$ is switched into the integrator circuit while the B-channel integrator capacitor $C_i1b$ is switched out of the circuit. Similarly, when the B-channel input $V_{inPb}$ is active, its associated integrator capacitor $C_i1b$ is switched into the integrator circuit while the A-channel integrator capacitor $C_i1a$ is switched out of the circuit. Also shown at the bottom of FIG. 3 are the various associated control signals.

To save the integrator output voltage on a capacitor it is necessary to disconnect the source of the voltage. In FIG. 3, the source of the voltage is the output of the integrator, and the signals outena and outenb control the connection of the integrator output to the integrator capacitors $C_i1a$ and $C_i1b$ respectively. This arrangement would be sufficient if the switches were ideal, but for practical switches there are parasitic capacitances from the switch terminals across the switch and to analog ground. And in some applications isolation between the input channels maybe important. Since the summing node will move due to the finite gain of the integrator opamp, this change can be coupled to the disconnected integrator capacitors $C_i1a$ and $C_i1b$. Thus, additional switches to reduce this affect may be included. These additional switches disconnect the summing node side of an inactive capacitor and connect it to the modulator common mode voltage. This tying of one end of the disconnected capacitor prevents the stored voltage across an inactive capacitor from drifting to either power rail due to switch device source-drain diode leakage.

With such a capacitor switching arrangement, the order that the switch control signals change is important to prevent coupling between the integrator capacitors and to save an accurate voltage across the capacitors. Because disconnecting the integrator capacitor Ci is like the input sampling, the LHS switch on the summing node should be disconnected first. Then the right hand side (RHS) switch at the opamp output is disconnected, and finally the capacitor is tied to the common mode voltage while it is inactive. Reconnecting the capacitor progresses in almost the reverse order. First the common mode is disconnected, and then the capacitor is connected to the summing node. This side is connected first because the summing node and the capacitor voltage are the same. Finally the opamp output is connected to the capacitor. If the opamp output were connected first, the capacitor voltages would have to slew to match the opamp output. The opamp output voltage will be very different because it is determined by the previous multiplexer input waveform. Connecting the summing node first reduces the voltage change the capacitor terminal voltages have to make to return the opamp to the closed loop integrator state with the new integration capacitor.

One, potential problem with the above architecture is due to the non-linear characteristics of the analog switches. In general, all of the parasitic capacitances change when the source or drain voltages change. This voltage dependency is also very non-linear. The integrated state-saving modulator architecture shown in FIG. 3 can minimize the effects of this non-linear capacitance in two ways:

(1) Fully differential signal flow so that matching parasitics to substrate on opposite sides cancel, and
(2) Ensuring that the switches used to control capacitor voltage have independent source and drain voltages that are constant regardless of the analog input voltage. The constant voltage may be the modulator common mode voltage (usually the reference voltage).

When the integrator capacitors are duplicated, as in FIG. 3, the RHS switches on the integrator output will see varying source and drain voltages depending on the output voltage of the integrators. The LHS switches on the integrator input see a constant voltage similar to the RHS switches of the input sampling path since the voltage at the beginning of a channel processing period are the common mode voltage (or the reference voltage).

Placing series switches on either side of the integrating capacitors creates additional series resistance having an RC time constant that adds a zero to the loop characteristics. The series switches should be sized to keep the phase margin greater than 60 degrees to preserve stability.

In one specific embodiment, both the first stage and the second stage have multiplexed integrating capacitors to save the integrator output state of inactive input channels. For an ideal modulator using this architecture, one would expect the integrator outputs to change when an input channel is active during a processing period and then stay constant when that input channel becomes inactive. Ideally, the integrator output is held at the level reached at the end of the last clock phase at the end of one channel processing period, and then returned to the same level by the end of the first clock phase of the next active processing period for that input channel. The error in the returned voltage at the end of the first clock phase of the subsequent processing period is generally the dominant error when multiplexing the integrator capacitors.

The addition of errors in the integrator output voltages during the transition from one processing period to the next for a given input channel (when the integrator output should be constant) may be too large for some applications. Generally, the errors closest to the input can be expected to be more significant. When both integrator stages are multiplexed in a two stage ADC modulator, the first integrator output may vary by 60 to 70 dB from the analog input, and the second integrator output may then vary by 120 to 140 dB from the original analog input. In an application such as measurement of three-phase electrical power, the goal may be to measure power over a 1000:1 range to 0.1% accuracy. This represents a 120 dB ratio of the maximum error to full scale. This suggests that the second stage errors can be allowed to be larger than the first stage errors. So, if the first stage is ideal, and the second stage has the capacitor voltage multiplexing errors described, the overall performance may be acceptable. This leads to a second specific embodiment.

Figure 4:
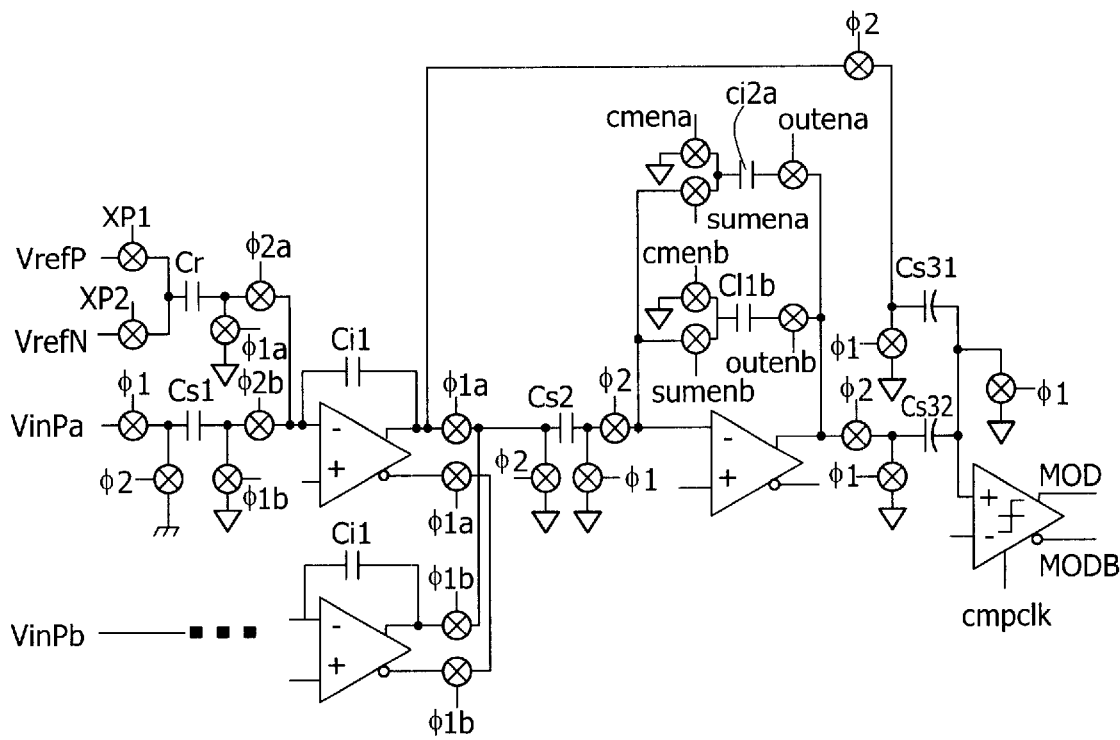
FIG. 4 shows a two-stage ADC modulator according to one embodiment of the present invention in which the first stage uses separate discrete integrators for each input channel, while the second stage uses the principle of parallel state saving capacitors to multiplex the integrator.

FIG. 4 shows a two-stage ADC modulator according to one embodiment of the present invention in which the first stage uses separate discrete integrators for each input channel, while the second stage uses the principle of parallel state saving capacitors to multiplex the integrator. As with FIG. 3, FIG. 4 is simplified to show only the positive half of the first and second stages. Similar arrangements are implemented for the negative half of the first and second stages, and for additional input channels.

In FIG. 4, multiplexing of the first stage is shifted to switches after the parallel discrete integrators. In an application to measure three phase electrical power, there would be 3 complete discrete integrators, and then a multiplexing switch arrangement to select the active integrator channel. The left hand side (LHS) switches of the second stage are already in this path, so appropriate gating of the clocking signals can merge the functionality of the second stage LHS switches and multiplexing of the first stage. Thus, the RHS switches of the first stage are the LHS switches of the second stage, and either terminology is accurate and may be used as context requires.

In the first stage integrators of FIG. 4, the $\phi 1a$ and $\phi 1b$ clock signals are LOW during modulator clocks when the respective time slot is inactive. The design strategy is to gate the RHS switches but not the LHS switches of the first stage input switch capacitor circuit. For the second stage, the LHS switches of the input path are gated. The differences between the first stage of a generic single analog input modulator and the first stage of this multiple analog input modulator can be summarized as follows:

(1) RHS switches are gated for first stage input and reference sampling.
(2) Input impedance is discontinuous because RHS switches are not continuous. Reference load will look continuous because only one reference sampling is active at a time.
(3) Common mode feedback loop is gated.
(4) First stage integrator output load has additional inactive switches on it, which represent additional non-linear capacitance.
(5) Modulator clock frequency is raised in comparison to a typical generic single input modulator. This may suggest increasing the bandwidth of the integrator opamps and decreasing the size of the integrating capacitors.

Embodiments of the present invention are designed to have complete settling of the integrator outputs at the time of sampling. This settling occurs when the RHS switches close (the falling edge of their clocking signals). The settling voltages should be analyzed for the input and output of each integrator stage at the end of their respective clocking signals, including checking both rising edge and negative edge transitions. Full settling should be when the voltage level is within the implied gain error from the finite gain of the integrator opamps; e.g., the open loop gain of the opamps may be between 60 and 70 dB. Full settling may be defined as the time required for a settling voltage to remain within less than 0.1% of the final value. If the target modulator clock frequency is 2.5 MHz (400 ns period), the available φ1 or φ2 active time would be at least 180 ns each.

In the processing circuitry after the modulator, each of the bit streams is made up of groups of concatenated samples, which may be de-multiplexed and processed as though they are continuous. Each channel bit stream has real-time gaps, of course, when referred to the input since the input is only sampled for a portion of the time, but these gaps are not significant at an appropriate sampling frequency. This means that a sinc filter as used in the prior art can still be used as long as its clocking is gated so that it is active only when the appropriate time slot is active.

This might be accomplished in a straightforward way by multiple sinc filters, one for each de-multiplexed bit stream, but some design considerations would remain. For example, whether and how to clock the filters during the time when the de-multiplexed bit stream is off needs to be considered. In specific embodiments of the present invention, the filters are not clocked when their associated time slots are inactive, i.e., discontinuous sampling. At the end of the last modulator clock cycle for a selected multiplexer input, the state of a modulator is determined by the voltage state of each integrator stage and the digital output value of the comparator are saved. When the multiplexer returns to that selected input, these values are restored and the modulator acts as though its clock were stopped when the selected input is inactive.

The filter architecture also needs to be appropriately designed to prevent corruption of a re-constructed waveform by images, aliasing, or other side affects of the multiplexing scheme. If the digital filters decimate the modulator output de-multiplexed bit stream, then the number of samples for each input processing period should be less than the decimation rate. This condition prevents images from the de-multiplexing, from showing up in the filter output passband.

Although various exemplary embodiments of the invention have been disclosed, it should be apparent to those skilled in the art that various changes and modifications can be made which will achieve some of the advantages of the invention without departing from the true scope of the invention.

What is claimed is:

1. A multiplexed signal processor comprising:
    an input circuit for receiving a plurality of input signals;
    a modulator for processing a selected input signal to produce a representative digital output, the modulator including an integrator that integrates the difference between the selected input signal and a feedback signal representative of the digital output; and
    a signal control circuit for selecting in turn by time division multiplexing each input signal for a processing period as the selected input signal, and for storing the digital output and the integrator state at the end of each processing period;
    wherein, after an initial processing period for each input signal, each processing period begins based on the digital output and the integrator state from the end of the previous processing period for that input signal.

2. A signal processor according to claim 1, wherein the plurality of input signals are analog signals.

3. A signal processor according to claim 1, wherein the plurality of input signals are digital signals.

4. A signal processor according to claim 1, wherein a switched capacitor arrangement stores at least one of the digital output and the integrator state.

5. A signal processor according to claim 1, wherein the signal processor is a sigma delta modulator.

6. A signal processor according to claim 1, further comprising:
    a filter in communication with the modulator for removing noise from the digital output.

7. A signal processor according to claim 6, wherein the filter is a sinc filter.

8. A method of signal processing comprising:
    receiving a plurality of input signals; and
    selecting in turn by time division multiplexing each input signal for a processing period, the processing period comprising:
        (i) processing the selected input signal to produce a representative digital output, the processing including using an integrator to integrate the difference between the selected input signal and a feedback signal representative of the digital output, and
        (ii) at the end of each processing period, storing the digital output and integrator state;
    wherein, after an initial processing period for each input signal, each processing period begins based on the digital output and the integrator state from the end of the previous processing period for that input signal.

9. A method according to claim 8, wherein the plurality of input signals are analog signals.

10. A method according to claim 8, wherein the plurality of input signals are digital signals.

11. A method according to claim 8, wherein storing the digital output and the integrator state uses a switched capacitor arrangement.

12. A method according to claim 8, wherein the method is performed by a sigma delta modulator.

13. A method according to claim 8, further comprising:
    removing noise from the digital output with a filter.

14. A method according to claim 13, wherein the filter is a sinc filter.

15. A multiplexed signal processor comprising:
    an input circuit for receiving a plurality of input signals;
    a multistage modulator for processing a selected input signal to produce a representative digital output, the modulator including at least two integrator stages, wherein:
        (i) one of the integrator stages includes a separate discrete integrator for each input signal, each integrator producing an output representing the integration of the discrete integrator input and the discrete integrator output, and
        (ii) the other integrator stage including a time division multiplexed integrator that selects each input signal in turn for a processing period to produce ah output representing the integration of the multiplexed integrator input and the multiplexed integrator output, wherein after an initial processing period for each input signal, each processing period begins based on the digital output and multiplexed integrator output from the end of the previous processing period for that input signal.

16. A signal processor according to claim 15, wherein the plurality of input signals are analog signals.

17. A signal processor according to claim 15, wherein the plurality of input signals are digital signals.

18. A signal processor according to claim 15, wherein a switched capacitor arrangement stores at least one of the digital output and the integrator state.

19. A signal processor according to claim 15, wherein the signal processor is a sigma delta modulator.

20. A signal processor according to claim 15, further comprising:

a filter in communication with the modulator for removing noise from the digital output.

21. A signal processor according to claim 20, wherein the filter is a sinc filter.

* * * * *

UNITED STATES PATENT AND TRADEMARK OFFICE
CERTIFICATE OF CORRECTION

PATENT NO. : 6,593,865 B2
DATED : July 15, 2003
INVENTOR(S) : Eric G. Nestler and Christopher M. Toliver It is certified that error appears in the above-identified patent and that said Letters Patent is hereby corrected as shown below:

Column 8,
Line 60, change "ah" to -- an --

Signed and Sealed this

Fourteenth Day of October, 2003

JAMES E. ROGAN
*Director of the United States Patent and Trademark Office*